United States Patent [19]
Martin et al.

[11] Patent Number: 5,094,013
[45] Date of Patent: Mar. 10, 1992

[54] ULTRA-FAST QUENCHING DEVICE

[75] Inventors: Jacob H. Martin, Wellesley; Frederick D. Browne, II, Somerville, both of Mass.

[73] Assignee: The Charles Stark Draper Laboratory, Inc., Cambridge, Mass.

[21] Appl. No.: 303,262

[22] Filed: Jan. 30, 1989

[51] Int. Cl.$^5$ .............................................. F26B 19/00
[52] U.S. Cl. ....................................... 34/62; 432/77
[58] Field of Search ................. 34/57 R, 57 A, 10, 62, 34/18, 23, 155, 156; 432/77, 78, 79, 80

[56] References Cited

U.S. PATENT DOCUMENTS 3,229,377  1/1966  Hoyt ................................. 34/10 X Primary Examiner—Henry A. Bennet
Attorney, Agent, or Firm—Joseph S. Iandiorio

[57] ABSTRACT

An ultra-fast quenching device for rapidly quenching material includes a housing for defining a quenching area. A plurality of inlet ports are disposed in the housing and are generally evenly distributed within the housing for controlling the locations and amounts of quenching fluid discharged against a surface of material disposed in the quenching area. A plurality of exhaust ports are disposed interstitially among the inlet ports for removing quenching fluid local to the inlet ports to control the rate and profile of heat transfer, from the material to the quenching fluid, across the surface of the material.

6 Claims, 5 Drawing Sheets

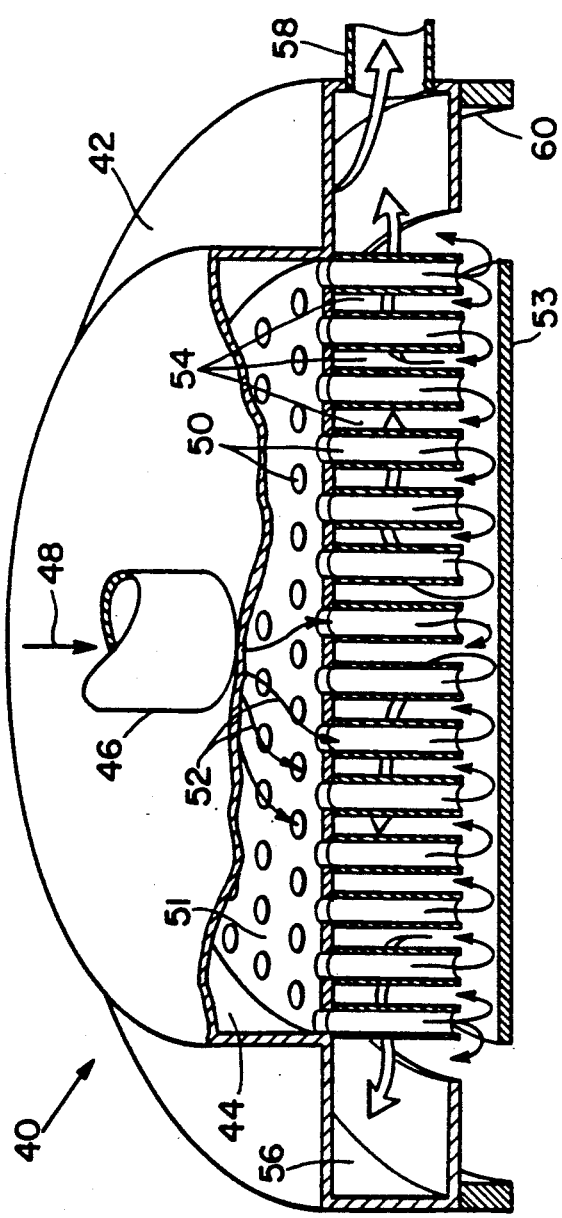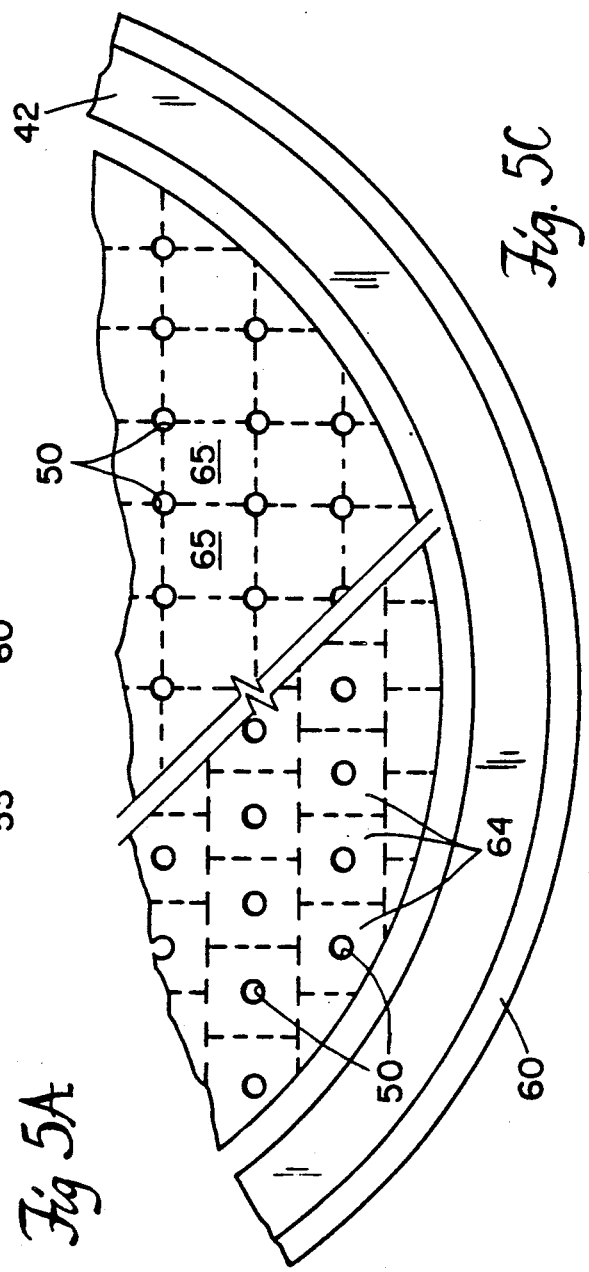

ULTRA-FAST QUENCHING DEVICE

FIELD OF INVENTION

The present invention relates to an ultra-fast quenching device and more specifically to such a device for controlling the distribution of quenching fluid to and exhaustion from the surface of a material using a plurality of inlet and exhaust ports.

BACKGROUND OF THE INVENTION

Ultra-fast quenching devices are necessary for rapidly cooling or quenching semiconductor material when it is annealed. Temperature uniformity across the surface of the material as it is quenched is also an important requirement. For example, rapid changes in temperature are necessary for achieving enhanced properties during the annealing process of gallium arsenide (GaAs) wafers. During this process, GaAs wafers are typically heated using high intensity light sources. The rate of heating is varied by adjusting the source intensity and by optically concentrating the radiation. After heating the wafers, the wafers are then quenched to limit and maintain control of the concentration of defects found in GaAs and to fix desirable crystal structure not obtainable by normal cooling at ambient temperature.

There are several methods available for quenching GaAs wafers as well as other semiconductor materials during the annealing process. One method of quenching includes cooling by radiation. The problem with this method of cooling is that the rate of radiation cooling for temperatures above several hundred degrees Celcius is mostly dependent on the temperature of the material and its surface area being cooled and cannot be accelerated appreciably by lowering the temperature below normal manufacturing ambients. The material also cools unevenly, since the edges of the material cool more rapidly than its center. Other methods of cooling such as conductive and convective cooling have been found to be less uniform than radiation cooling because of the problem of controlling the effect of the coolant over the surface of the material.

SUMMARY OF INVENTION

It is therefore an object of this invention to provide an improved ultra-fast quenching device for controlling the rate of heat transfer across the surface of a material.

It is a further object of this invention to provide such a quenching device that uniformly and more rapidly transfers heat from the surface of a material.

It is a further object of this invention to provide such a quenching device for controlling the application of quenching fluid to and removal from the surface of a material.

It is a further object of this invention to provide such a quenching device which employs different quenching fluids.

It is a further object of this invention to provide such a quenching device which quenches the material using either a one or two phase fluid.

It is a further object of this invention to provide such a quenching device which can transfer heat from the surface of a material to the quenching fluid at an increased rate.

It is a further object of this invention to provide such a quenching device which can quench the material by applying quenching fluid simultaneously to two or more sides of the material.

It is a further object of this invention to provide such a quenching device which regulates the distribution of the quenching fluid on the surface of the material to control the profile of heat transferred across the surface of the material.

It is a further object of this invention to provide such a quenching device that impinges quenching fluid on opposing surfaces of the material for suspending the material during quenching.

It is a further object of this invention to provide such a quenching device that can rotate the material to significantly reduce temperature gradients across its surface during quenching by impinging quenching fluid at an angle on opposing surfaces of the suspended material.

This invention results from the realization that a truly effective quenching device for rapidly quenching a material at an increased rate can be accomplished by providing a plurality of evenly distributed inlet ports for controlling the distribution of quenching fluid across the surface of the material and a plurality of exhaust ports interstitially disposed relative to the inlet ports for removing quenching fluid local to inlet ports to control the rate and profile of heat transferred, from the material to the quenching fluid, across the surface of the material.

This invention features an ultra-fast quenching device for rapidly quenching a material. The device includes a housing for defining a quenching area. A plurality of inlet ports are disposed in the housing and are generally evenly distributed within the housing for controlling the locations and amounts of quenching fluid discharged against a surface of a material disposed in the quenching area. A plurality of exhaust ports are also disposed in the housing and are generally evenly distributed over the quenching area. The exhaust ports are interstitially disposed relative to the inlet ports for removing quenching fluid local to the inlet ports to control the rate and profile of heat transfer, from the material to the quenching fluid, against the surface of the material.

The plurality of the exhaust ports can form a continuous exhaust area within the housing, and the plurality of inlet ports can include a plurality of discrete conduits disposed within the exhaust area. Alternatively, the plurality of inlet and exhaust ports are defined by a plurality of discrete conduits evenly disposed within the housing. Each of the discrete conduits, defining the plurality of inlet ports, can have approximately the same cross sectional area.

The ultra-fast quenching device can further include means for distributing quenching fluid to the plurality of inlet ports for delivery to the surface of the material to be quenched. The means for regulating can include an inlet plenum. The plurality of inlet ports can discharge the quenching fluid evenly onto the surface of the material to cool the material uniformly across its surface. The plurality of inlet ports can be tilted at an angle with respect to the surface of the material to be quenched. The ultra-fast quenching device may further include an exhaust plenum for receiving the quenching fluid, which can be a gas, a liquid, a vaporizable liquid or a liquid entrained in the gas, from the exhaust ports. The device can also include means, attached to the housing, for sealing the area to be quenched.

In another embodiment, an ultra-fast quenching device for rapidly quenching a material includes two housings disposed for defining between them a quenching area. The plurality of inlet ports can distribute quenching fluid against opposing surfaces of the material for suspending and supporting the material in the quenching area.

DISCLOSURE OF PREFERRED EMBODIMENTS

Other Objects, features and advantages will occur to those skilled in the art from the following description of preferred embodiments and the accompanying drawings, in which:

FIG. 5A is a partially sectioned three-dimensional view of a portion of an alternative quenching device according to this invention;

FIG. 5C is a partially sectioned bottom view of the quenching device of FIG. 5A.

Figure 1:
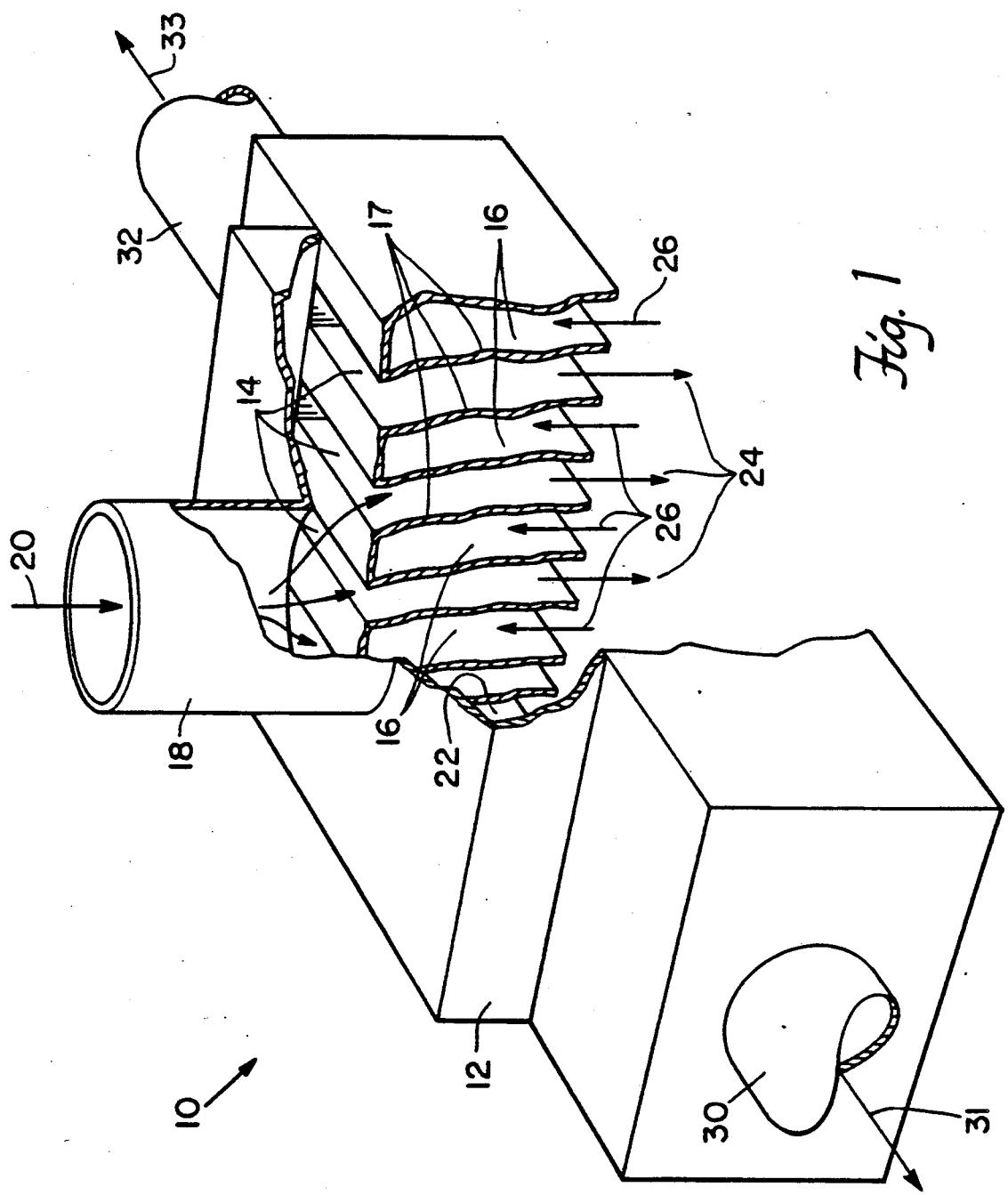
FIG. 1 is a three-dimensional view of a quenching device according to the present invention.

An ultra-fast quenching device according to the present invention for rapidly quenching material at an increased rate per second or more can be accomplished using a housing having a plurality of inlet and exhaust ports. The housing which generally defines a quenching area can be large enough to quench the entire surface of the material such as a wafer or continuously and sequentially quench portions of the surface area of a sheet or a ribbon of material passing through the quenching area. The device can be constructed from any durable, compatible, non-contaminating material such as sheet metal.

In one construction, the inlet and exhaust ports are discrete conduits evenly distributed within a housing. The locations and amounts of quenching fluid distributed on the surface of the material is controlled by properly designing the cross-sectional area of each of the inlet ports. Preferably, the cross-sectional areas of the inlet ports are equal, but they can be designed to have different cross-sectional areas for distributing more quenching fluid on some areas of the material than others. This is particularly important in applications where edge effects cause the center surface area of the material to cool more slowly than its edges. The quenching fluid is exhausted from the surface of the material by the plurality of exhaust ports which are interstitially disposed relative to the inlet ports for quickly removing quenching fluid that is locally discharged by the inlet ports.

This construction of the inlet and exhaust ports allows the quenching fluid to be applied at high velocities to the surface of the material in a controlled manner and to be quickly exhausted from its surface and to provide high and controlled rates of heat transfer. Further, the profile of heat transfer across the surface of material can be adjusted to maintain a more uniform temperature across the surface of the material during quenching by properly adjusting the flow rate of the quenching fluid across the surface. The device can also be pressurized by placing a seal around the housing to enclose the quenching area.

In another construction, an ultra-fast quenching device includes a housing having a plurality of inlet ports disposed within an exhaust area. The inlet ports provide a controlled distribution of quenching fluid over the surface of the material to be quenched. An area proximate each of the plurality of inlet ports serves as an exhaust port for uniformly removing quenching fluid locally discharged by at least one of the plurality of inlet ports. This construction also permits the rate and profile of heat transferred across the surface of the material to be controlled.

The ultra-fast quenching device can include two housings, each disposed proximate to opposing surfaces of the material. Quenching fluid can be introduced by the inlet ports, disposed in each housing, for supporting the material between the housings as it is quenched. The inlet ports may also be angled for rotating the material during quenching to reduce temperature gradients across the surface of the material. The inlet and outlet plenums and pipes are sized throughout to minimize their pressure drop relative to the pressure drop in the ports. The figures herein are not proportional in this regard but are schematic only.

Figure 2:
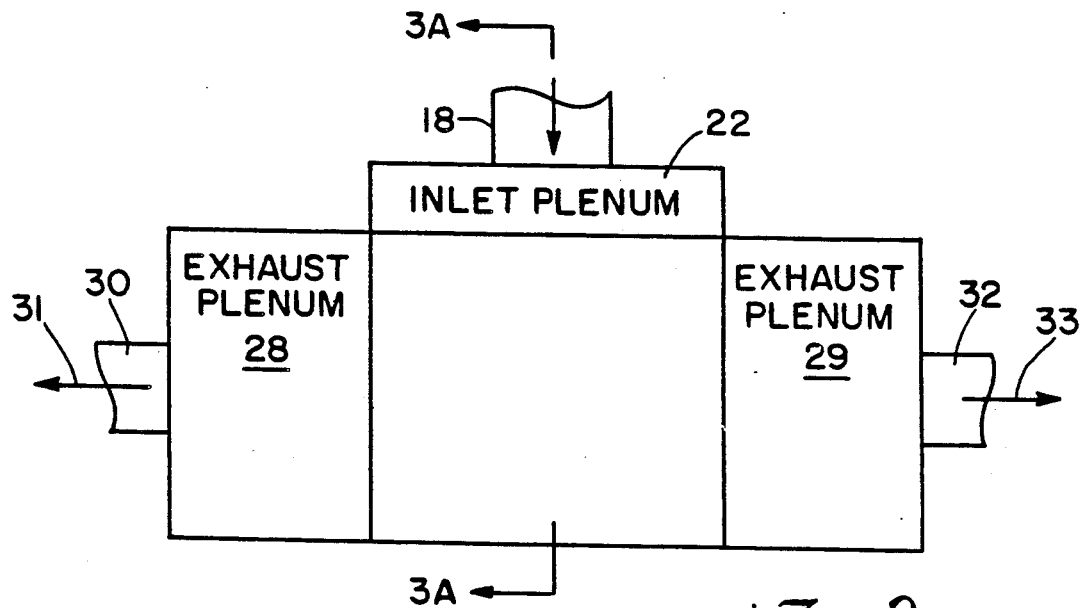
FIG. 2 is a side view of the quenching device of FIG. 1.

In the preferred embodiment, an ultra-fast quenching device 10 includes a container 12 for housing a plurality of inverted "U" shaped conduits 17 which define a row of inlet ports 14 and exhaust ports 16, FIG. 1. Container 12 also includes an inlet plenum 22 and two exhaust plenums 28 and 29, FIG. 2.

Figure 3A:
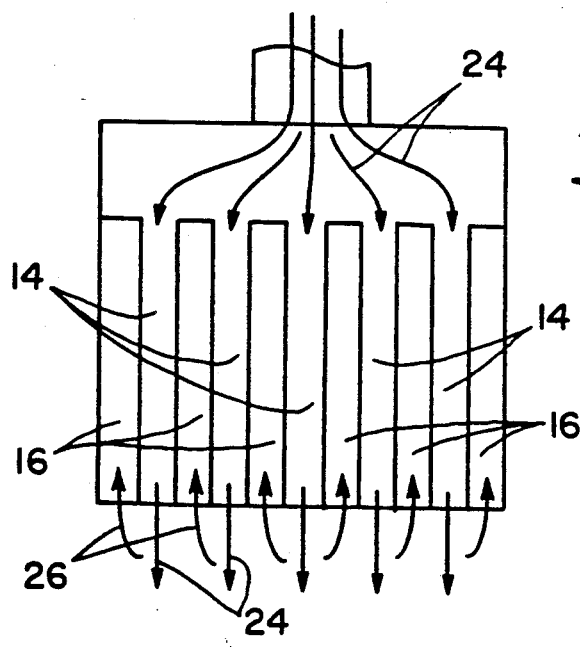
FIG. 3A is a side sectional view along the lines 3—3 of FIG. 2.

Inlet ports 14, FIG. 1, and exhaust ports 16 are alternated for establishing a substantially uniform application of quenching fluid across the surface of a material, not shown, to be quenched. Quenching fluid is fed to the housing through inlet pipe 18 as indicated by arrow 20 to plenum 22 which insures that quenching fluid is evenly distributed to inlet ports 14. Inlet ports 14 cause quenching fluid from plenum 22 to impinge on the surface of the material as indicated by arrows 24 shown in FIGS. 1 and 3A. Quenching fluid local to each inlet port 14 is then exhausted by adjacent exhaust ports 16 as indicated by arrows 26. From exhaust ports 16, quenching fluid enters exhaust plenums 28, 29, FIG. 2, and is discharged through outlet pipes 30 and 32 as illustrated by arrows 31 and 33, FIGS. 1 and 2. Exhausting quenching fluid local to each inlet port 14 insures that the quenching fluid to be exhausted, travels only a small distance across the surface of the material, thus minimizing the mixing of heated quenching fluid with adjacent inlet quenching fluid and controlling the velocity of the fluid across the area to be quenched.

The size, distribution, and number of inlet ports 14 and exhaust ports 16 depends on the surface area of the material to be quenched, the rate at which the material is to be quenched and the quenching fluid to be used.

Figure 3C:
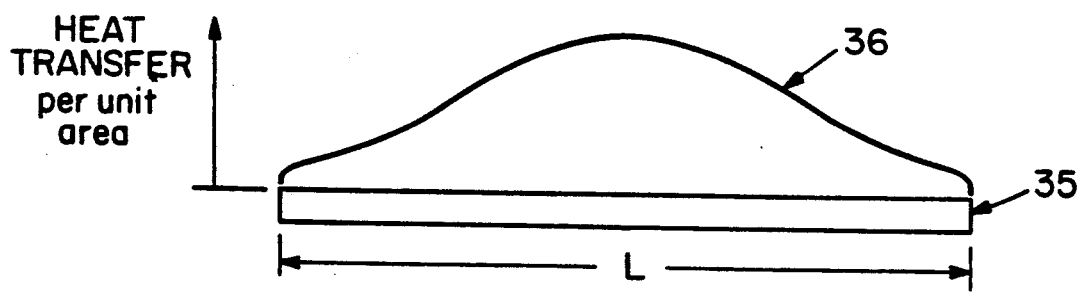
FIG. 3C is a graphical illustration of the heat transfer profile across the surface of a material to be quenched by the device of FIG. 3B.
Figure 3B:
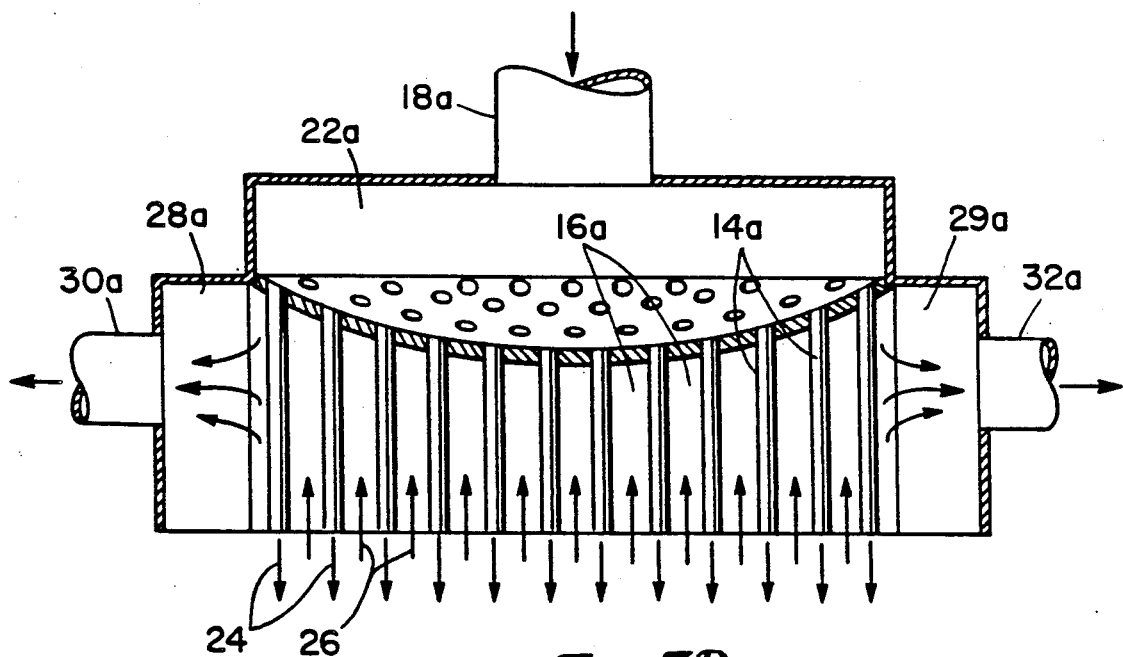
FIG. 3B is a side sectional view of an alternative quenching device showing inlet and exhaust ports having different lengths for controlling the profile of heat transferred across the surface of the material.

For example, inlet ports 14a, FIG. 3B proximate the center of a material to be quenched have a shorter length than inlet port 14b proximate to the edges of the material. The length of exhaust ports 16a proximate the center of material 35 are also shorter than the length of exhaust ports 16b proximate its sides to exhaust the increased volume of quenching fluid applied to the surface of the material by local inlet ports 14a. As a result, the profile of heat transfer per unit of area, illustrated by curve 36, FIG. 3C, across the surface of material 35 is controlled to have a higher rate of heat transferred at the center of material 35 than at its edge. The benefit of controlling the heat transfer in this manner is that the material may be more uniformly quenched across its surface or the material can have increased quenching in particular areas. By applying these teachings of the invention, increased quenching rates can be achieved and controlled across the surface of the material.

A vaporizable quenching fluid is preferably used for achieving ultra high cooling rates. For example, when liquid coolant impinges the surface of the material, all or a portion of the liquid changes phase resulting in vapor that is quickly exhausted. Alternatively, the cooling fluid may be a gas with entrained liquid droplets. When a fluid that changes phase is used to quench material, it is preferred that the total area of the exhaust ports is greater than that of the inlet ports for removing the increased volume of coolant which results when the coolant changes phases. The total cross sectional areas of inlet ports 14 and exhaust ports 16 generally can be equal when a single phase quenching fluid is used.

Figure 4:
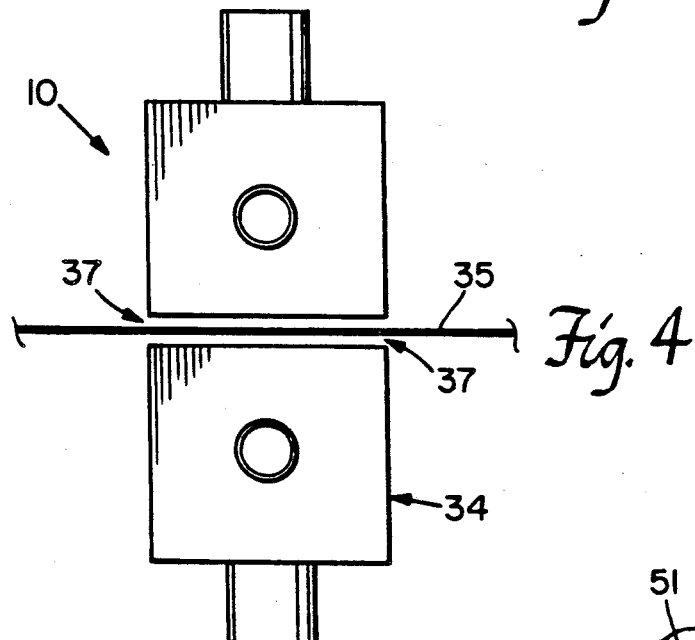
FIG. 4 is a side view of two quenching devices shown in FIG. 1 situated for quenching opposing surfaces of a ribbon of material passing between the devices.

The time required to quench material can be significantly reduced when quenching device 10, FIG. 4, is used in conjunction with a second quenching device 34. Second quenching device 34 is placed to face the opposing surface of material 35. Quenching devices 10 and 34 arranged in this manner are particularly useful for simultaneously quenching opposing surface areas of a wafer placed within quenching area 37 or a continuous ribbon of material passing through quenching area 37.

In another embodiment, an ultra-fast quenching device 40, FIG. 5A, for achieving an improved quenching rate includes an annular housing 42, which is placed proximate to material 53 that is to be quenched. Housing 42 includes an inlet plenum 44 which receives quenching fluid, arrow 48, through an inlet pipe 46. Inlet plenum 44 ensures that quenching fluid is evenly distributed to each of the inlet ports 50 as indicated by arrows 52 for delivery to the surface of material 53.

Figure 5B:
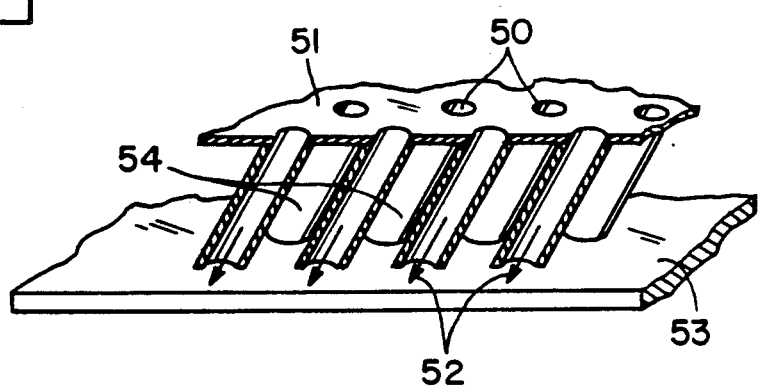
FIG. 5B is a partially sectioned, three-dimensional view of a portion of an alternative quenching device similar to the quenching device shown in FIG. 5A, but having angled inlet ports.

Inlet ports 50 are pipes uniformly disposed within an exhaust area 54 and attached at one end to a plate 51 which serves as a base plate for inlet plenum 44. Each pipe also extends from plate 51 into exhaust area 54 in approximately the same direction, which is perpendicular to the surface of the material to be quenched. Alternatively, the quenching fluid can be directed at a different angle as illustrated in FIG. 5B.

Exhaust area 54, which includes the area interstitially disposed among each of the inlet ports, exhausts the quenching fluid, locally discharged by inlet ports 50, uniformly and rapidly. Conceptually, exhaust area 54 can be thought of as consisting of a plurality of exhaust ports 64, FIG. 5C, in which each exhaust port 64 surrounds an inlet port 50. Alternatively, a plurality of exhaust ports 65 are disposed about each conceptual inlet port for exhausting quenching fluid delivered to the surface of the material by a plurality of adjacent inlet ports 50.

Quenching fluid from exhaust area 54, FIG. 5A, is discharged to an annular exhaust plenum 56 and exits housing 42 via exhaust pipe 58. Exhaust plenum 56 insures that quenching fluid is uniformly exhausted from exhaust area 54. A seal 60 attached to housing 42 seals the area to be quenched. Seal 60 permits the pressure of the quenching gases in the system to be increased for increased heat transfer rates. Sealing also enables recycling of the quenching fluid in a closed loop system.

Figure 6:
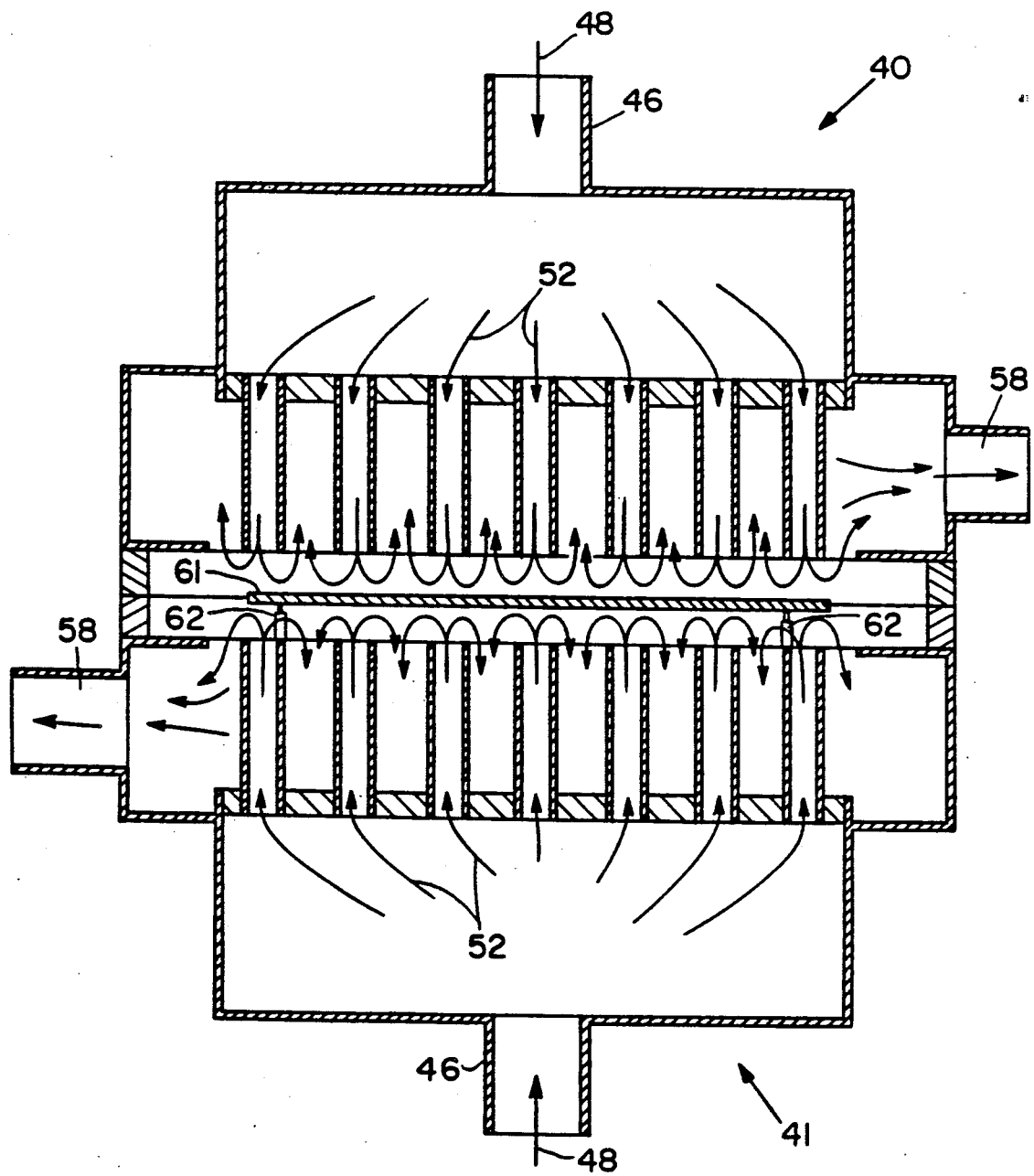
FIG. 6 is a sectional side view of two quenching devices situated for quenching opposing surfaces of a wafer material disposed between the devices.

Quenching of material 61, FIG. 6, is further enhanced when it is placed between two quenching devices 40, 41. Initially material 61 is placed on and supported by quartz support pins 62 or similar non-contaminating material. During quenching, quenching fluid is introduced through inlet ports 50 with such force that material 61 is suspended or supported by the quenching fluid. If the inlet ports are angled, as illustrated in FIG. 5B, material 61 can be rotate during quenching. This further reduces the temperature gradients across its surfaces during quenching. The labelling of the specific ports, plenums and pipes as inlet and outlet in the description of the figures is not limiting. The nomenclature and direction of flow could be the reverse of that shown.

Although specific features of the invention are shown in some drawings and not others, this is for convenience only as each feature may be combined with any or all of the other features in accordance with the invention.

Other embodiments will occur to those skilled in the art and are within the following claims. For example, different physical arrangements of inlet and exhaust port areas may be provided to establish an array of quenching orifices for uniformly impinging and exhausting quenching fluid over the surface area of the material to be quenched.

What is claimed is:

1. An ultra-fast quenching device comprising:
   an inlet plenum for supplying a cooling fluid;
   a plurality of spaced exhaust conduits traversing said inlet plenum and establishing between them a plurality of inlet ports for providing fluid communication between aid inlet plenum and a surface to be quenched,
   said exhaust conduits being u-shaped in cross section with the open side disposed toward said surface;
   an exhaust plenum in fluid communication with said exhaust conduits for removing said fluid after contact with said surface.

2. An ultra-fast quenching device for rapidly quenching a material, comprising:
   first and second inlet plenums defining between them a quenching area for supplying a cooling fluid to said area;
   first and second pluralities of spaced exhaust conduits traversing said first and second inlet plenums respectively, for establishing a first and second pluralities of inlet ports providing fluid communication between said plenums and said quenching area, said exhaust conduits being u-shaped in cross section and having open sides disposed toward said quenching area;
   first and second exhaust plenums in fluid communication with said first and second pluralities of exhaust conduits, respectively, for drawing a fluid away from said quenching area.

3. The ultra-fast quenching device of claim 1 in which each of said inlet ports have approximately the same cross sectional area for discharging quenching fluid substantially evenly across the surface of the material.

4. The ultra-fast quenching device of claim 1 in which each of said exhaust conduits have approximately the same cross sectional area for removing quenching fluid substantially evenly across the surface of the material.

5. The ultra-fast quenching device of claim 1 in which said plurality of inlet ports are angled with respect to the surface of the material to be quenched.

6. The ultra-fast quenching device of claim 2 in which said pluralities of inlet ports simultaneously distribute quenching fluid against opposing surfaces of the material to be quenched for suspending the material in the quenching area.

* * * * *